United States Patent
Kiermasz et al.

(10) Patent No.: US 7,459,100 B2
(45) Date of Patent: Dec. 2, 2008

(54) METHODS AND APPARATUS FOR SEQUENTIALLY ALTERNATING AMONG PLASMA PROCESSES IN ORDER TO OPTIMIZE A SUBSTRATE

(75) Inventors: Adrian Kiermasz, Union City, CA (US); Tamarak Pandhumsoporn, Fremont, CA (US); Alferd Cofer, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 210 days.

(21) Appl. No.: 11/022,983

(22) Filed: Dec. 22, 2004

(65) Prior Publication Data

US 2006/0131271 A1    Jun. 22, 2006

(51) Int. Cl.
C23F 1/00 (2006.01)
(52) U.S. Cl. .......................................... 216/67
(58) Field of Classification Search .............. None
See application file for complete search history.

(56) References Cited

U.S. PATENT DOCUMENTS

| | | | |
|---|---|---|---|
| 5,081,590 A * | 1/1992 | Gominho et al. ............ | 702/117 |
| 5,498,312 A | 3/1996 | Laermer et al. | |
| 5,501,893 A | 3/1996 | Laermer et al. | |
| 6,071,822 A | 6/2000 | Donohue et al. | |
| 6,100,200 A | 8/2000 | Van Buskirk et al. | |
| 6,127,273 A | 10/2000 | Laermer et al. | |
| 6,187,685 B1 | 2/2001 | Hopkins et al. | |
| 6,200,822 B1 | 3/2001 | Becker et al. | |
| 6,211,092 B1 | 4/2001 | Tang et al. | |
| 6,214,161 B1 | 4/2001 | Becker et al. | |
| 6,261,962 B1 | 7/2001 | Bhardwaj et al. | |
| 6,284,148 B1 | 9/2001 | Laermer et al. | |
| 6,303,512 B1 | 10/2001 | Laermer et al. | |
| 6,316,169 B1 | 11/2001 | Vahedi et al. | |

(Continued)

FOREIGN PATENT DOCUMENTS

EP    0822582 A    2/1998

(Continued)

OTHER PUBLICATIONS

International Seach Report mailed Jul. 3, 2007, re PCT/US05/45725.

(Continued)

*Primary Examiner*—Allan Olsen
(74) *Attorney, Agent, or Firm*—IP Strategy Group, P.C.

(57) ABSTRACT

In a plasma processing system, a method for optimizing etching of a substrate is disclosed. The method includes selecting a first plasma process recipe including a first process variable, wherein changing the first process variable by a first amount optimizes a first substrate etch characteristic and aggravates a second substrate etch characteristic. The method also includes selecting second plasma process recipe including a second process variable, wherein changing the second process variable by a second amount aggravates the first substrate etch characteristic and optimizes the second substrate etch characteristic. The method further includes positioning a substrate on a chuck in a plasma processing chamber; and striking a plasma within the plasma processing chamber. The method also includes alternating between the first plasma recipe and the second plasma recipe, wherein upon completion of the alternating, the first substrate etch characteristic and the second substrate etch characteristic are substantially optimized.

24 Claims, 9 Drawing Sheets

U.S. PATENT DOCUMENTS

| | | | |
|---|---|---|---|
| 6,387,287 B1 | 5/2002 | Hung et al. | |
| 6,459,945 B1* | 10/2002 | Singh et al. | 700/108 |
| 6,489,632 B1 | 12/2002 | Yamazaki et al. | |
| 6,578,190 B2* | 6/2003 | Ferguson et al. | 716/21 |
| 6,609,086 B1* | 8/2003 | Bao et al. | 702/189 |
| 6,617,253 B1 | 9/2003 | Chu et al. | |
| 6,633,793 B2* | 10/2003 | Wu et al. | 700/110 |
| 7,085,676 B2* | 8/2006 | Opsal et al. | 702/182 |
| 2003/0033043 A1* | 2/2003 | Wu et al. | 700/109 |
| 2003/0139907 A1* | 7/2003 | McCarthy | 702/183 |
| 2004/0267490 A1* | 12/2004 | Opsal et al. | 702/127 |
| 2007/0055403 A1* | 3/2007 | MacDonald et al. | 700/108 |

FOREIGN PATENT DOCUMENTS

| | | |
|---|---|---|
| GB | 2026397 A | 2/1980 |
| WO | WO-03/003405 A | 1/2003 |
| WO | WO-2004/017368 A | 2/2004 |
| WO | WO-2005/048301 A | 5/2005 |

OTHER PUBLICATIONS

Written Opinion of the ISA mailed Jul. 3, 2007, re PCT/US05/45725.

International Preliminary Report on Patentability mailed Aug. 30, 2007, re PCT/US2005/045725.

"Theory of file growth," no author information, no date available, 10 pages total.

"Applied Mateirals P500 Etcher," 2 pages total, from filed://Y:/Clients?lam%20Research/LAM%20CASES%2051520THR..., no date available.

Hopkins et al., "The Benefits of Process Parameter Ramping During the Plasma Etching of High Aspect Ratio Silicon Structures," Proceedings of the Materials Research Society Fall Meeting, Boston, Massachusetts, USA, Dec. 1998, pp. 1-7.

Huang et al., "Gas Distrubution System Having Fast Gas Switching Capabilities," Lam Reference No. P1206, 41 pages total, no date avaliable.

Heckman et al., "The Evolution of RF Power Delivery in Plasma Processing," Advanced Energy Whitepaper, 1998, pp. 1-8.

"National Industrial Chemicals Notification and Assessment Scheme: Full Public Report: Difluoromethane," File No. NA/159, 27 pages total, no date available.

May, Paul, "MSc Physics of Advanced Semiconductor Materials: Plasmas and Plasma Processing:," http://www.chm.bris.ac.uk/~paulmay/misc/msc/msc1.htm, 9 pages total, no date available.

Hudson et al., "Method for Plasma Etching Using Periodic Modulation of Gas Chemistry," 46 pages total, no date available.

Dobkin, Daniel M., "Surface Reactions and Film Formation," 5 pages total, http://www.batnet.com/enigmatics/semiconductor_processing/CVD_Fundamentals/chemistry/surface_reactions.html, no date available.

Otto et al., "Simulation of Dry Silicon Etching in Absence of Ion Bombardment—an Example for Cooperation between Process Development and Equipment Design," pp. 88-91.

Rack, Philip D. "Plasma Etching Outline," 34 pages total, no date available.

Chang et al., "Plasma-surface Interactions," 2003 American Vacuum Society, J. Vac. Sci. Technol. A 21(5), Sep./Oct. 2003, pp. S145-S151.

Fleming et al., "CHE 290 Group Project: Plasma Etching," Dec. 4, 2000, 16 pages total.

Rees et al., "Processing Plasmas Face a Testing Time," 4 pages total, no date available.

"Chapter 3: Semiconductor Processing," Plasma Processing and Processing Science, 2000 The National Academy of Science, http://www.nap.edu/openbook/N100021/html/7.html.

Chu, Paul K., "Chapter 3: Epitaxy," City University of Hong Kong, 31 pages total, no date available.

"EPO Search Report", Issued in EP Application No.: EP 05 85 4442; Mailing Date: Sep. 19, 2008.

* cited by examiner

METHODS AND APPARATUS FOR SEQUENTIALLY ALTERNATING AMONG PLASMA PROCESSES IN ORDER TO OPTIMIZE A SUBSTRATE

BACKGROUND OF THE INVENTION

The present invention relates in general to substrate manufacturing technologies and in particular to methods and apparatus for sequentially alternating among plasma processes in order to optimize a substrate.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited.

Generally, process variables are often adjusted in order to main acceptable plasma process characteristics, such as etch rate, uniformity, selectivity, etch profile, etc. Etch rate is the measure of how fast material is removed in the etch process. It is an important characteristic of the process, since it directly affects the throughput of the etch process. The etch rate can be calculated by measuring the film thickness before and after the etch process and dividing the thickness difference by the etch time.

Uniformity is the degree of etch rate consistency across a substrate surface. It is normally measured by thickness at certain points before and after the etch process, and calculating the etch rates at these points. Selectivity is the ratio of the etch rates between the different materials, especially the material that needs to be etched compared with the material that should not be removed. Profile is the degree of verticalness of an etch. Generally, the greater in surface uniformity of a feature wall, the better the profile.

Among the set of process variables that can be adjusted are the process time, RF power, chamber pressure, gas composition, gas flow, substrate bias, RF frequency, etc. However, although in theory it may be beneficial to optimize each variable for each plasma process characteristic, in practice it is often difficult to achieve. Very often optimum process conditions can only be maintained within a narrow window of parameters, and hence not practical from a manufacturability standpoint. By adjusting one variable to improve one characteristic, another characteristic may deteriorate.

In general, there are three types of etch processes used to etch the various layers on the substrate: pure chemical etch, pure physical etch, and reactive ion etch.

Pure chemical etching generally involves no physical bombardment, but rather a chemical interaction of neutral molecules (neutrals) with materials on the substrate (e.g., Al, etc.). Subsequently, the chemical reaction rate could be very high or very low, depending on the process. For example, fluorine-based molecules tend to chemically interact with dielectric materials on the substrate, wherein oxygen-based molecules tend to chemically interact with organic materials on the substrate, such as photoresist.

Pure ion etching, often called sputtering, is used to dislodge material from the substrate (e.g., oxide, etc.). Commonly an inert gas, such as Argon, is ionized in a plasma and subsequently accelerate toward a negatively charged substrate. Pure ion etching is both anisotropic (i.e., principally in one direction) and non-selective. That is, selectivity to a particular material tends to be very poor, since sputtering rate of most materials are similar. In addition, the etch rate of the pure ion etching is commonly low, depending generally on the flux and energy of the ion bombardment.

Reactive ion etch (RIE), also called ion-enhanced etching, combines both chemical and ion processes in order to remove material from the substrate (e.g., photoresist, BARC, TiN, Oxide, etc.). Generally ions in the plasma enhance a chemical process by striking the surface of the substrate, and subsequently breaking the chemical bonds of the atoms on the surface in order to make them more susceptible to reacting with the molecules of the chemical process. Since ion etching is mainly perpendicular, while the chemical etching is both perpendicular and vertical, the perpendicular etch rate tends to be much faster than in then horizontal direction. In addition, RIE tends to have an anisotropic profile.

However, one problem that has been encountered with both pure chemical etching and RIE etching has been a non-uniform etch rate. Etch rate is generally the measure of how fast material is removed in the etch process. It is generally calculated by measuring the thickness before and after the etch process and dividing the thickness difference by the etch time.

In general, the etch rate is typically higher at the edge of the substrate where the local etch rate may be dominated by either chemical reactions at the surface, or by limited etchant transport to the substrate surface. That is, since less substrate surface area is available to etch for a given volume of etchant, a greater etch rate tends to result.

Referring now to FIG. 1, a simplified diagram of plasma processing system components is shown. Generally, an appropriate set of gases is flowed into chamber 102 through an inlet 109 from gas distribution system 122. These plasma processing gases may be subsequently ionized at injector 108 to form a plasma 110, in order to process (e.g., etch or deposition) exposed areas of substrate 114, such as a semiconductor substrate or a glass pane, positioned with edge ring 115 on an electrostatic chuck 116. In addition, liner 117 provides a thermal barrier between the plasma and the plasma processing chamber, as well as helping to optimize plasma 110 on substrate 114.

Induction coil 131 is separated from the plasma by a dielectric window 104, and generally induces a time-varying electric current in the plasma processing gases to create plasma 110. The window both protects induction coil from plasma 110, and allows the generated RF field to penetrate into the plasma processing chamber. Further coupled to induction coil 131 at leads 130a-b is matching network 132 that may be further coupled to RF generator 138. Matching network 132 attempts to match the impedance of RF generator 138, which typically operates at 13.56 MHz and 50 ohms, to that of the plasma 110.

Referring now to FIG. 2, a simplified view of an etch process is shown. In general, a plasma etch process is substantially complex, and influenced by many factors. For example, an RF field creates several types species in plasma 110, such as high energy electrons, positive ions, negative ions, neutrals, and radicals. Positive ions are created when an electron is completely removed from a gas molecule or atom. Likewise, negative ions although rare, are created when an electron is added to a gas molecule or atom.

Radicals are created when electron collisions break up molecules into fragments which as a result have unsatisfied chemical bonding and are chemically reactive. Since they have no net charge, and therefore are not accelerated by the field or are not attracted by charged particles, they tend have a long lifetime compared to charged particles. Neutrals are stable, having neither a positive nor negative charge, nor are chemically active. Generally, two of the most important parameters are the number density and energy distribution of the electrons, which play a central role in initiating and maintaining the plasma.

In general, in a plasma etch process, directional etching is achieved by sidewall passivation, often through polymer formation 224 on the etch front. The amount of sidewall passivation depends on the amount of etch product and mask area, and it changes dramatically as one moves from isolated features to densely populated portions of the integrated circuit. The amount of sidewall passivation material determines the profile of the structure.

Some of the reactants in the plasma are transported to the substrate surface 202, where reaction 201 may occur, such as physi-sorption or chemisorption 204. In chemisorption, a strong "chemical bond" is formed between the adsorbed atom or molecule and the substrate. Physisorption is weaker, and is often being considered as having no chemical interaction involved.

Other reactants may then be transported to etch front 214, or deflected away if composed of ions 208. In combination with substrate temperature control 216 and bias creation 218, these factors may subsequently affect profile 210 and surface quality 212. As previously described, ions are often used in etch reaction 220 to physically dislodged material from the substrate (e.g., oxide, etc.), while neutrals and radicals may be used in a chemical etch reaction 220. Reaction by-products often diffuse back into the main plasma gas stream and may be subsequently pumped 228 from plasma chamber 230.

Referring now to FIG. 3, a simplified diagram comparing etch rate to RF power in a plasma etch process. All other plasma process characteristics held constant, at low RF power, fewer ions may be available in the plasma to enable the chemical process by striking the surface of the substrate. As RF power increases, additional ions are created, enabling the overall etch rate to increase. However, increasing the RF power still further stabilizes the etch rate, since the plasma, saturated with ions, has a smaller mean free path. Mean free path (MFP) may be defined as the average distance that the ion can travel before it collides with another particle. In general, the shorter the MFP, the smaller the amount of ions that reach the surface of the substrate.

Referring now to FIG. 4, a simplified diagram comparing etch rate to pressure in a plasma etch process is shown. In contrast to FIG. 3, all other plasma process characteristics held constant, in general, for physically dominant etching, increasing pressure will tend to reduce mean free path, and hence the number of ions available for etching. That is, by increasing pressure, more ion collisions result in decreased ion energy.

Referring now to FIG. 5, a simplified diagram comparing uniformity to RF power in a plasma etch process is shown. All other plasma process characteristics held constant, in general, at low RF power, fewer ions may be available in the plasma to enable the chemical process by striking the surface of the substrate. As RF power increases, additional ions are created, enabling the overall etch rate to increase. However, as there is more etchant available at the edge of the substrate than at the center, the edge etch rate tends to be greater than the center etch rate, decreasing the substrate uniformity. Increasing the RF power still further saturates the plasma with ions, reducing mean free path.

Referring now to FIG. 6, a simplified diagram comparing uniformity to pressure in a plasma etch process is shown. In contrast to FIG. 5, all other plasma process characteristics held constant, in general, initially increasing pressure also increases the etchant transport to the substrate surface, equalizing the etch rate between the edge and center of the substrate. However, as before, increasing pressure still further saturates the plasma with ions which also reduces mean free path, and hence the amount of ions available to reach the surface of the substrate.

Referring now to FIG. 7, a simplified diagram comparing selectivity to RF power in a plasma etch process is shown. All other plasma process characteristics held constant, in general, increasing RF power reduces etch selectivity since the etch process tends to be more physical (i.e., sputtering) and less chemical. As previously described, selectivity is the ratio of the etch rates between the different materials, especially the material that needs to be etched compared with the material that should not be removed.

Referring now to FIG. 8, a simplified diagram comparing selectivity to pressure in a plasma etch process is shown. In contrast to FIG. 7, all other plasma process characteristics held constant, in general, increasing pressure tends to increase selectivity, since the plasma, saturated with ions, has a smaller MFP. Since fewer ions are available to reach the substrate surface, the etch process tends to be less physical and more chemical.

Referring now to FIG. 9 a simplified diagram comparing vertical-ness of etch profile to RF power in a plasma etch process is shown. All other plasma process characteristics held constant, in general, increasing RF power tends to increase the number of ions and hence the vertical etch rate and subsequent vertical profile. As previously described, ion etching tends to be mainly perpendicular to the substrate while the chemical etching is both perpendicular and vertical.

Referring now to FIG. 10 a simplified diagram comparing vertical-ness of etch profile to pressure in a plasma etch process is shown. In contrast to FIG. 9, all other plasma process characteristics held constant, in general, as pressure is increases, the vertical-ness of the etch profile decreases, since the plasma, saturated with ions, has a smaller MFP. Since fewer ions are available to reach the substrate surface, the etch process less physical and more chemical.

In view of the foregoing, there are desired improved methods and apparatus for sequentially alternating among plasma processes in order to optimize a substrate.

SUMMARY OF THE INVENTION

The invention relates, in one embodiment, in a plasma processing system, to a method for optimizing etching of a substrate. The method includes selecting a first plasma process recipe including a first process variable, wherein changing the first process variable by a first amount optimizes a first substrate etch characteristic and aggravates a second substrate etch characteristic. The method also includes selecting second plasma process recipe including a second process variable, wherein changing the second process variable by a second amount aggravates the first substrate etch characteristic and optimizes the second substrate etch characteristic. The method further includes positioning a substrate on a chuck in a plasma processing chamber; and striking a plasma within the plasma processing chamber. The method also includes alternating between the first plasma recipe and the second plasma recipe, wherein upon completion of the alternating, the first substrate etch characteristic and the second substrate etch characteristic are substantially optimized.

The invention relates, in another embodiment, in a plasma processing system, to a method for optimizing etching of a substrate. The method includes selecting a first set of plasma process recipes including a first process variable, wherein changing the first process variable by a first amount optimizes a first substrate etch characteristic and aggravates a second substrate etch characteristic. The method also includes selecting second set of plasma process recipes including a second process variable, wherein changing the second process variable by a second amount aggravates the first substrate etch characteristic and optimizes the second substrate etch characteristic. The method further includes positioning a substrate on a chuck in a plasma processing chamber; and striking a plasma within the plasma processing chamber. The method also includes alternating between the first plasma recipe and the second plasma recipe, wherein upon completion of the alternating, the first substrate etch characteristic and the second substrate etch characteristic are substantially optimized.

The invention relates, in another embodiment, in a plasma processing system, to an apparatus for optimizing etching of a substrate. The apparatus includes means for selecting a first plasma process recipe including a first process variable, wherein changing the first process variable by a first amount optimizes a first substrate etch characteristic and aggravates a second substrate etch characteristic. The apparatus also includes means for selecting second plasma process recipe including a second process variable, wherein changing the second process variable by a second amount aggravates the first substrate etch characteristic and optimizes the second substrate etch characteristic. The apparatus further includes means for positioning a substrate on a chuck in a plasma processing chamber; and striking a plasma within the plasma processing chamber. The apparatus also includes means for alternating between the first plasma recipe and the second plasma recipe, wherein upon completion of the alternating, the first substrate etch characteristic and the second substrate etch characteristic are substantially optimized.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that substantially optimal plasma process characteristics (i.e., as etch rate, uniformity, selectivity, etch profile, etc.) can be achieved by alternating among a set of complementary etch process recipes, each of which may have an inverse affect on the plasma process characteristic. That is, a first etch process recipe may improve etch rate but aggravate selectivity, while a second etch process recipe may have the opposite affect.

Figure 1:
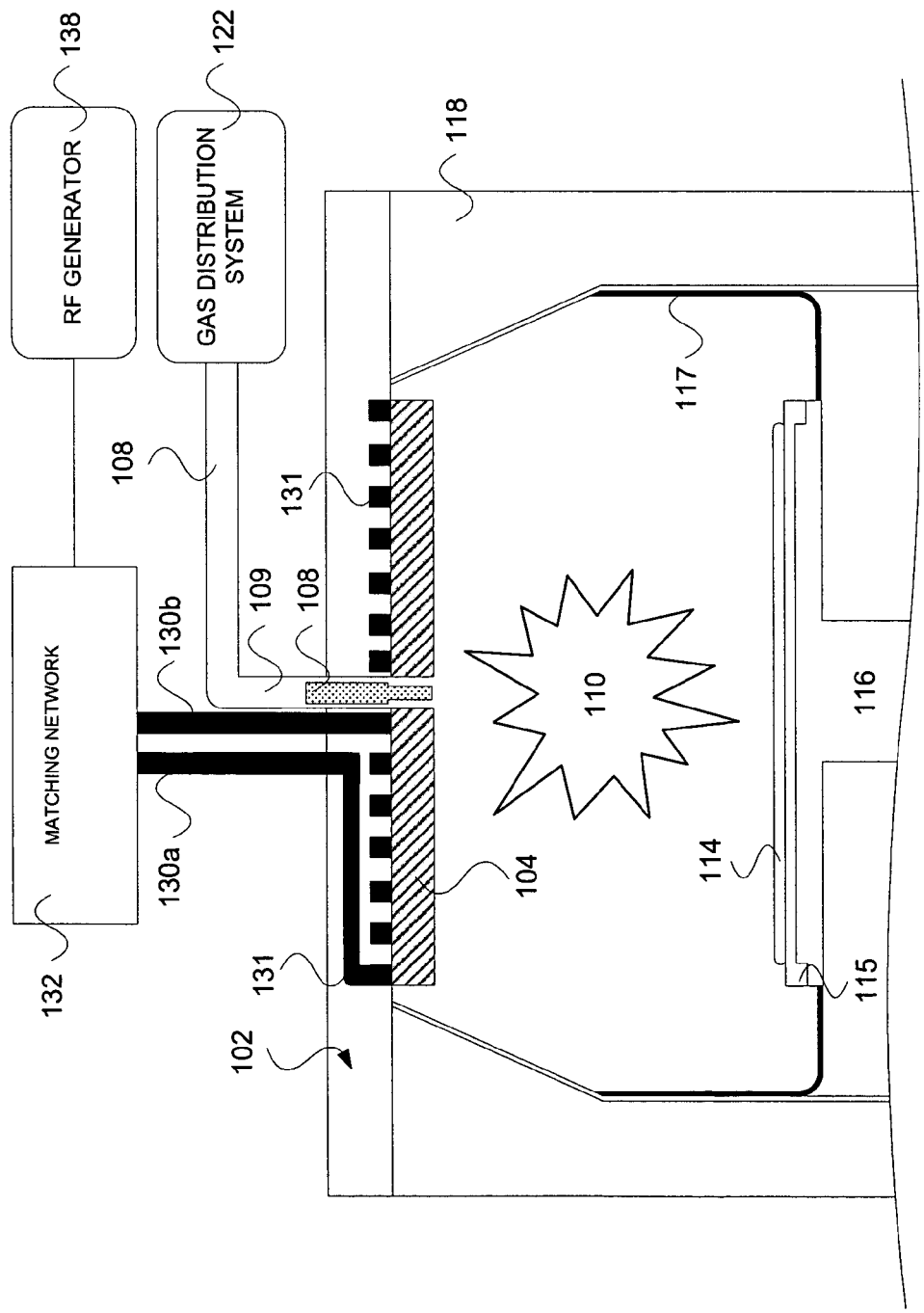
FIG. 1 shows a simplified diagram of plasma processing system components.
Figure 2:
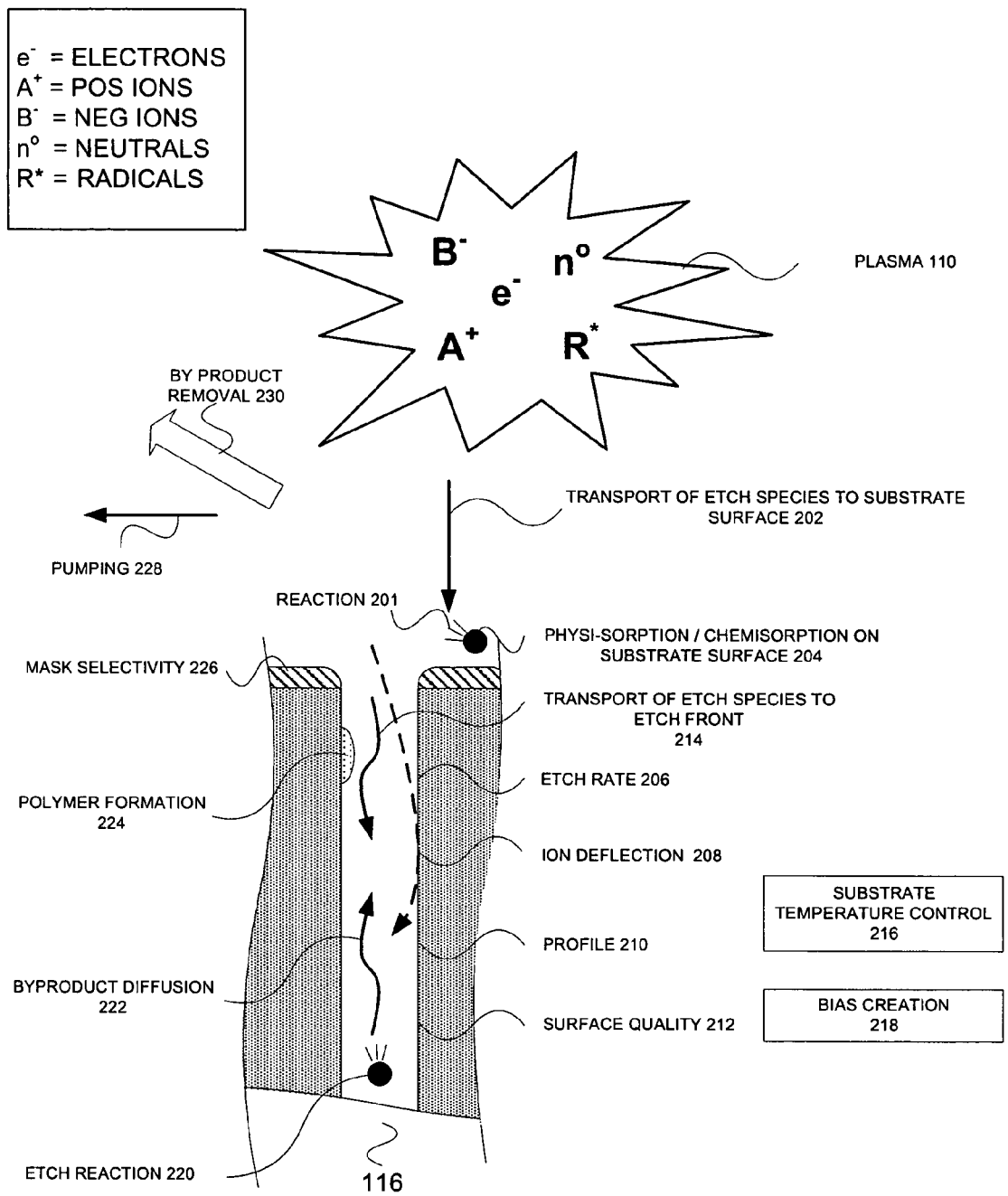
FIG. 2 shows a simplified view of a plasma etch process.
Figure 3:
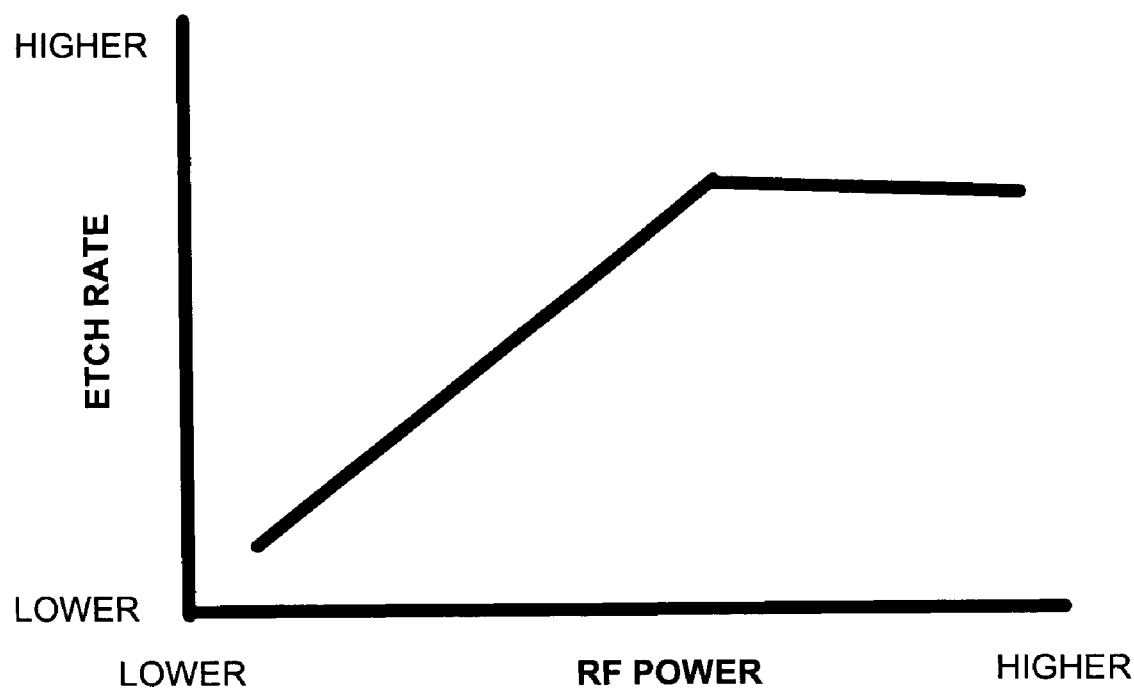
FIG. 3 shows a simplified diagram comparing etch rate to RF power in a plasma etch process.
Figure 4:
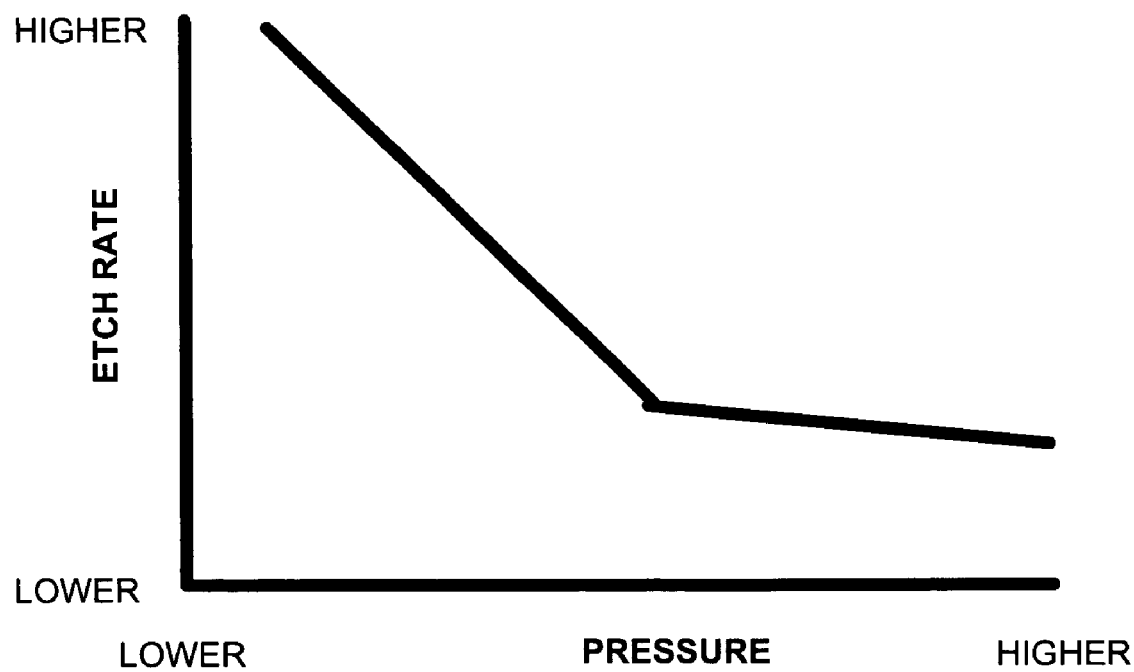
FIG. 4 shows a simplified diagram comparing etch rate to pressure in a plasma etch process.
Figure 5:
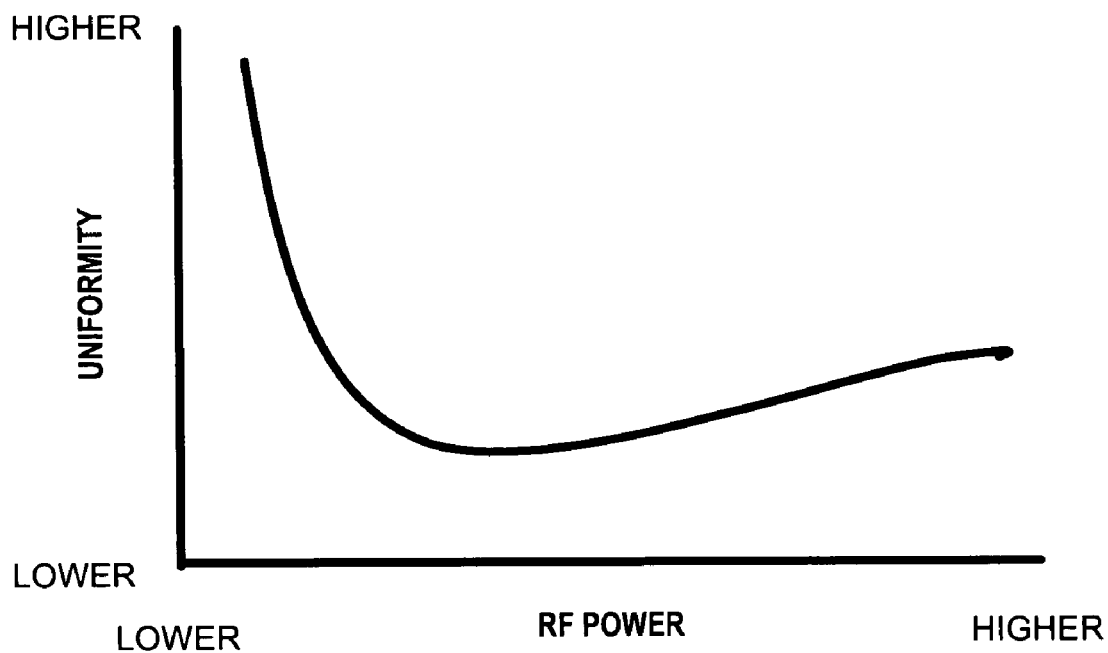
FIG. 5 shows a simplified diagram comparing uniformity to RF power in a plasma etch process.
Figure 6:
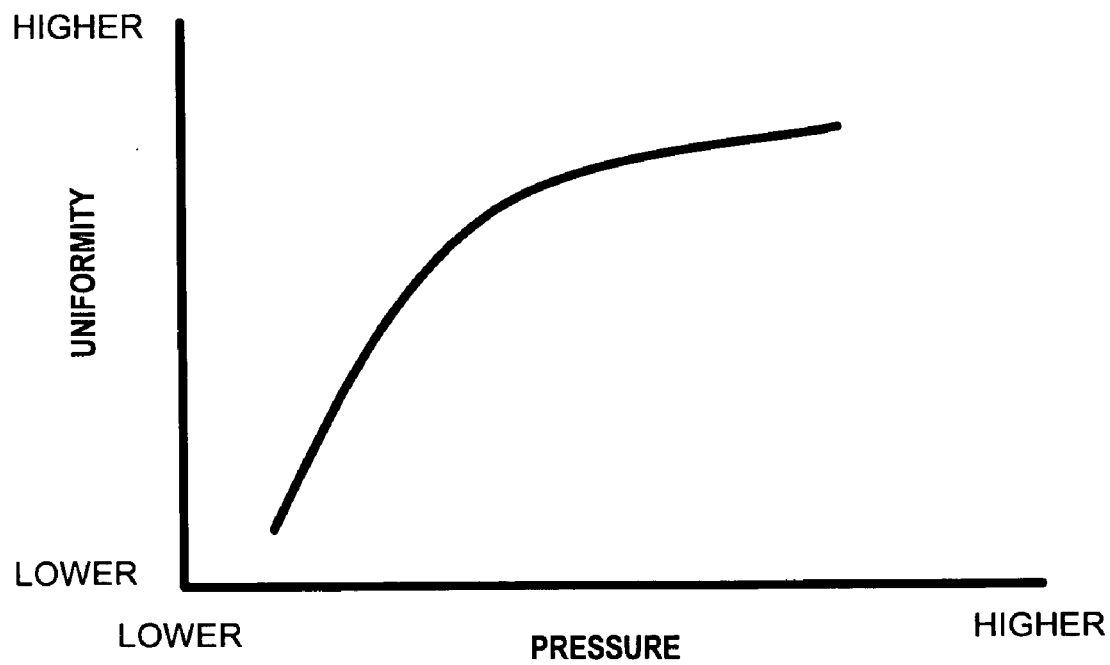
FIG. 6 shows a simplified diagram comparing uniformity to pressure in a plasma etch process.
Figure 7:
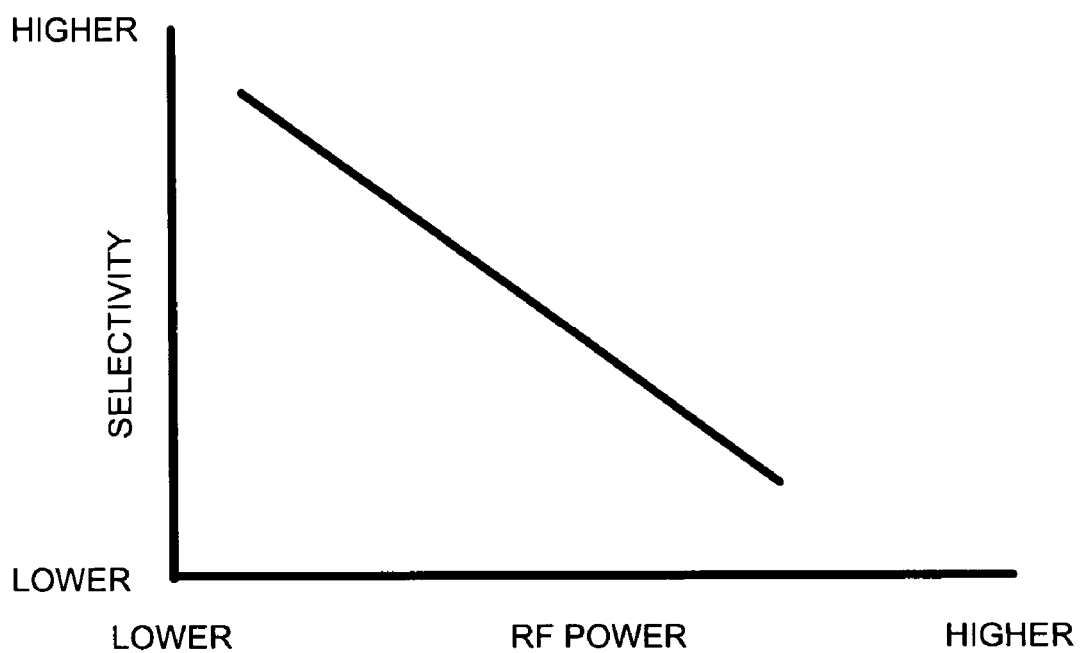
FIG. 7 shows a simplified diagram comparing selectivity to RF power in a plasma etch process.
Figure 8:
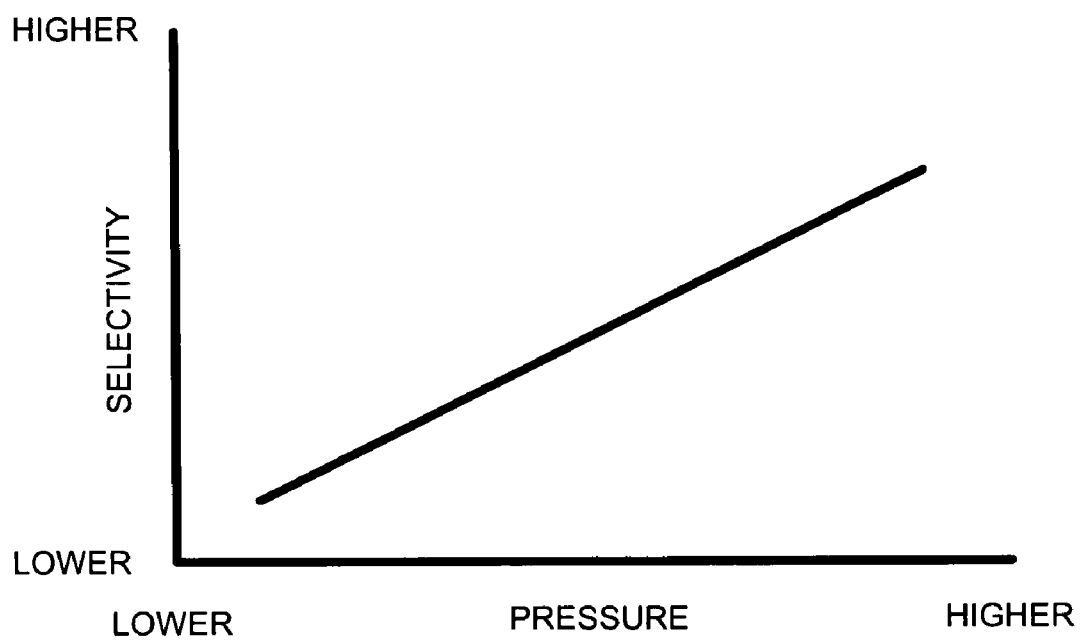
FIG. 8 shows a simplified diagram comparing selectivity to pressure in a plasma etch process.
Figure 9:
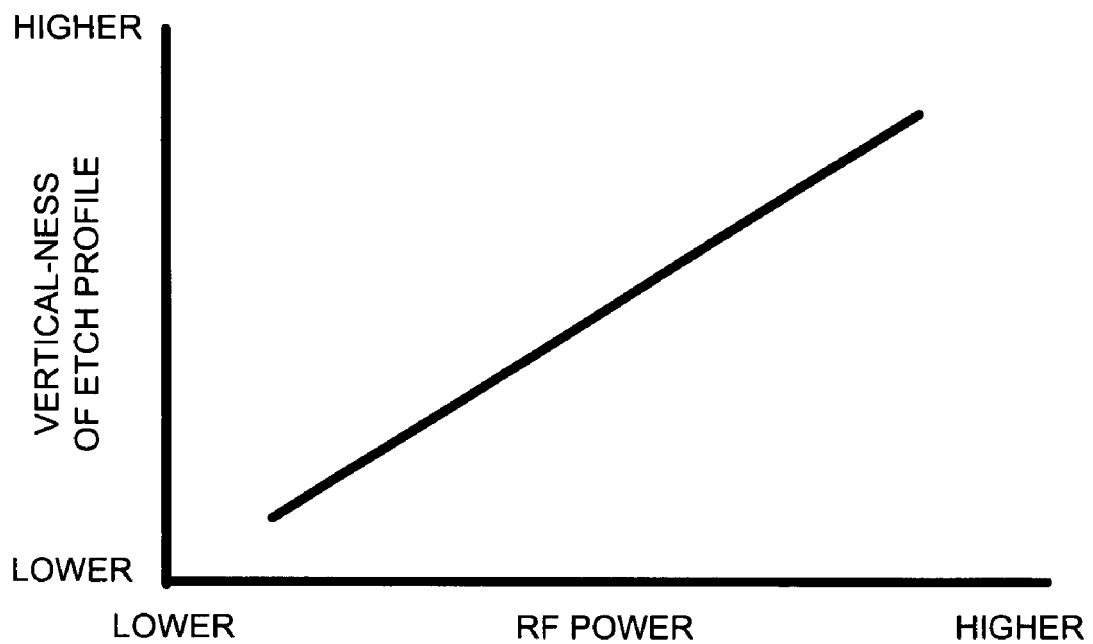
FIG. 9 shows a simplified diagram comparing vertical-ness of etch profile to RF power in a plasma etch process.
Figure 10:
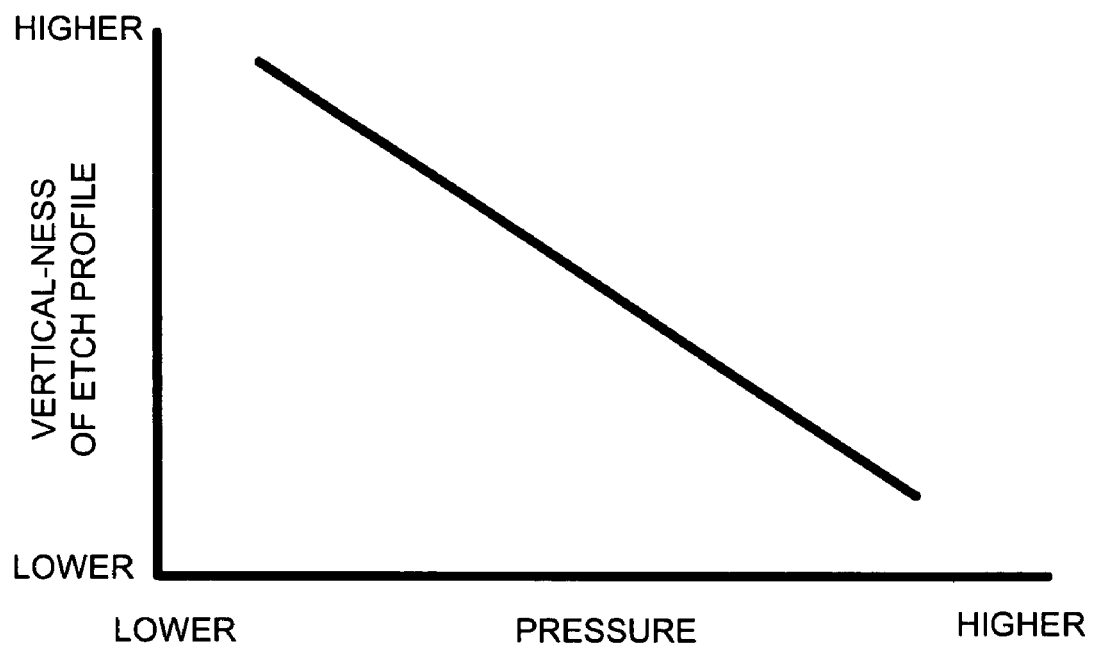
FIG. 10 shows a simplified diagram comparing vertical-ness of etch profile to pressure in a plasma etch process.
Figure 11:
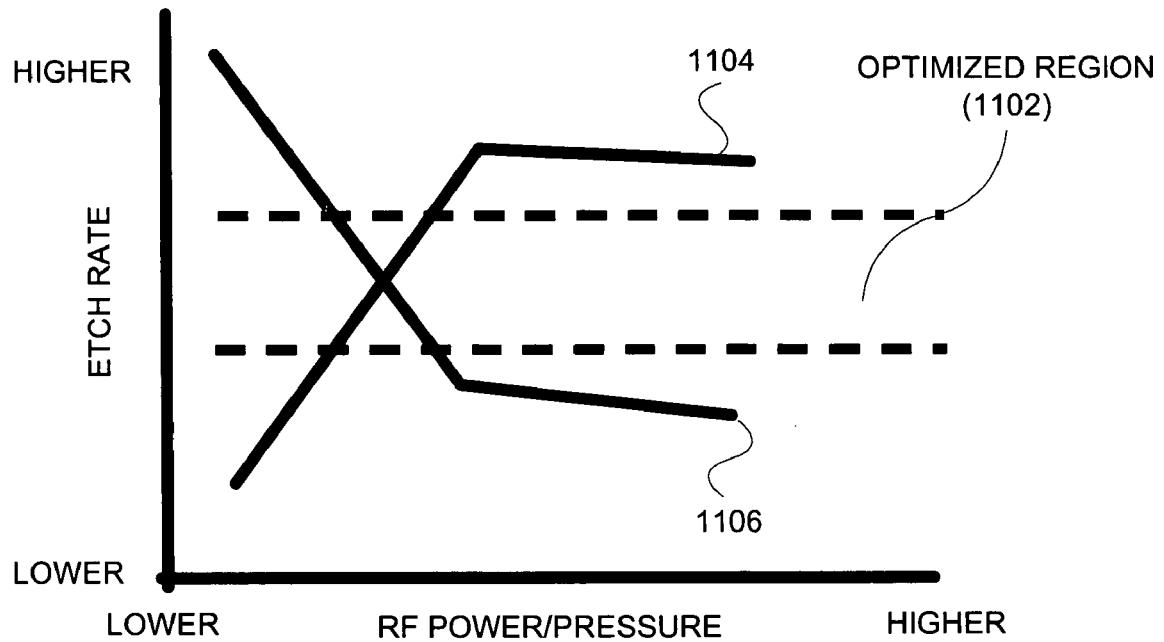
FIG. 11 shows a substantially optimum etch rate that may be achieved by alternating among a set of complementary etch process recipes, according to one embodiment of the invention.

By cycling or alternating between the etch process recipes, the optimizing and aggravating affects of each process recipe can be averaged out, resulting in a substantially optimal result for most plasma process characteristics. In one embodiment, the process recipes may be alternated once every few seconds. In another embodiment, a first process recipe creates a convex effect on a substrate characteristic, while a second process recipe creates a concave effect on a substrate. In yet another embodiment, the substantially optimal result is a set of points, or region of values, representing plasma process characteristics Referring now to FIG. 11, a substantially optimum etch rate may be achieved by alternating among a set of complementary etch process recipes, according to one embodiment of the invention. All other plasma process characteristics held constant, in a first process 1104, at low RF power, fewer ions may be available in the plasma to enable the chemical process by striking the surface of the substrate. As RF power increases, additional ions are created, enabling the overall etch rate to increase. However, increasing the RF power still further stabilizes the etch rate, since the plasma, saturated with ions, has a smaller mean free path. In general, the smaller the MFP, the smaller the amount of ions that reach the surface of the substrate.

In a second process 1106, increasing pressure will tend to reduce mean free path, and hence the number of ions available for etching. By cycling or alternating between the etch process recipes, the optimizing and aggravating affects of each process recipe can be averaged out, resulting in an etch rate in optimized region 1102.

Figure 12:
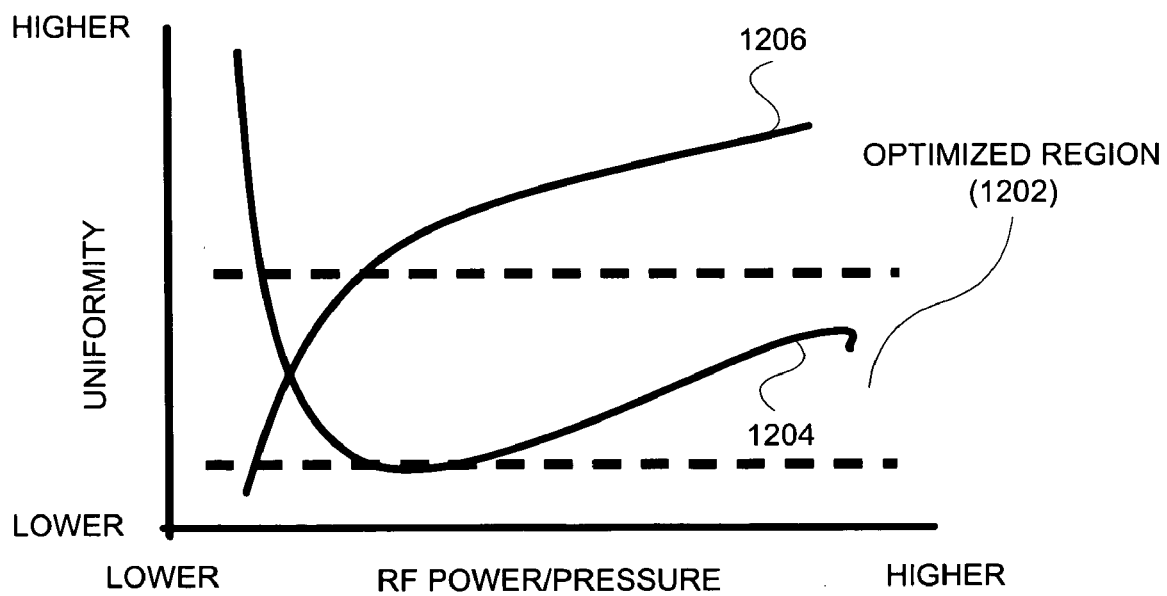
FIG. 12 shows a substantially optimum uniformity that may be achieved by alternating among a set of complementary etch process recipes, according to one embodiment of the invention.

Referring now to FIG. 12, a substantially optimum uniformity may be achieved by alternating among a set of complementary etch process recipes, according to one embodiment of the invention. All other plasma process characteristics held constant, in a first process 1204, at low RF power, fewer ions may be available in the plasma to enable the chemical process by striking the surface of the substrate. As RF power increases, additional ions are created, enabling the overall etch rate to increase. However, as there is more etchant available at the edge of the substrate than at the center, the edge etch rate tends to be greater than the center etch rate, decreasing the substrate uniformity. Increasing the RF power still further saturates the plasma with ions, reducing mean free path.

In a second process 1206, in general, initially increasing pressure also increases the etchant transport to the substrate surface, equalizing the etch rate between the edge and center of the substrate. However, increasing pressure still further saturates the plasma with ions which also reduces mean free path, and hence the amount of ions available to reach the surface of the substrate. By cycling or alternating between the etch process recipes, the optimizing and aggravating affects of each process recipe can be averaged out, resulting in a uniformity in optimized region 1202.

Figure 13:
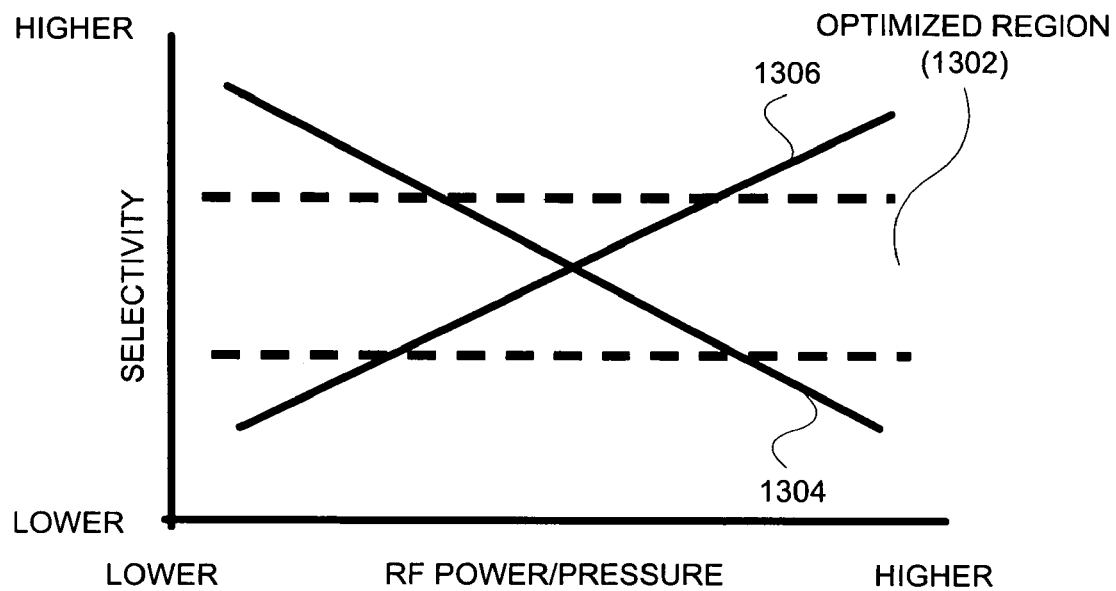
FIG. 13 shows a substantially optimum selectivity that may be achieved by alternating among a set of complementary etch process recipes, according to one embodiment of the invention.

Referring now to FIG. 13, a substantially optimum selectivity may be achieved by alternating among a set of complementary etch process recipes, according to one embodiment of the invention. All other plasma process characteristics held constant, in a first process 1304, in general, increasing RF power reduces etch selectivity since the etch process tends to be more physical (i.e., sputtering) and less chemical.

In a second process 1306, in general, increasing pressure tends to increase selectivity, since the plasma, saturated with ions, has a smaller MFP. Since fewer ions are available to reach the substrate surface, the etch process tends to be less physical and more chemical. By cycling or alternating between the etch process recipes, the optimizing and aggravating affects of each process recipe can be averaged out, resulting in a selectivity in optimized region 1302.

Figure 14:
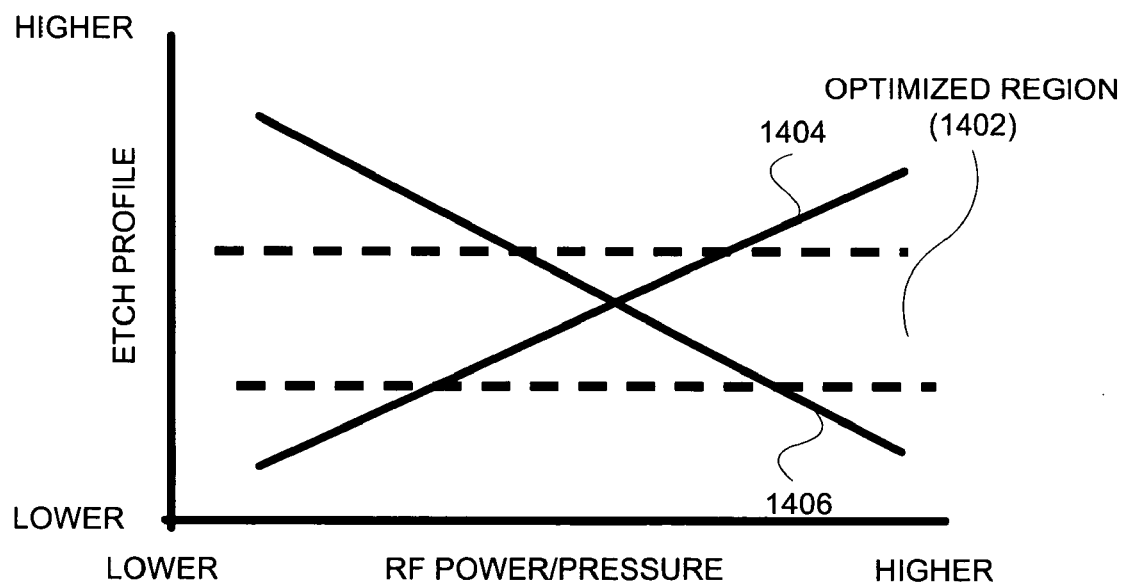
FIG. 14 shows a substantially optimum etch profile may be achieved by alternating among a set of complementary etch process recipes, according to one embodiment of the invention.

Referring now to FIG. 14, a substantially optimum etch profile may be achieved by alternating among a set of complementary etch process recipes, according to one embodiment of the invention. All other plasma process characteristics held constant, in a first process 1404, in general, increasing RF power tends to increase the number of ions and hence the vertical etch rate and subsequent vertical profile.

In a second process 1406, in general, as pressure is increases, the vertical-ness of the etch profile decreases, since the plasma, saturated with ions, has a smaller MFP. Since fewer ions are available to reach the substrate surface, the etch process less physical and more chemical. By cycling or alternating between the etch process recipes, the optimizing and aggravating affects of each process recipe can be averaged out, resulting in an etch profile in optimized region 1402.

For, example, in an exemplary etch process in a Lam Research Alliance 9400 DSiE™ plasma processing system, etch rate may be optimized by alternating between two recipes. A first recipe may include: $SF_6$: 50 sccm, pressure: 50 mtorr, TCP power: 500 watts, bias: −150v, time: 10 seconds. While the second recipe may include: $C_4F_8$: 50 sccm, pressure: 60 mtorr, TCP power: 500 watts, bias −1300v, time: 5 seconds. The number of steps can be repeated as many as is needed.

Figure 15:
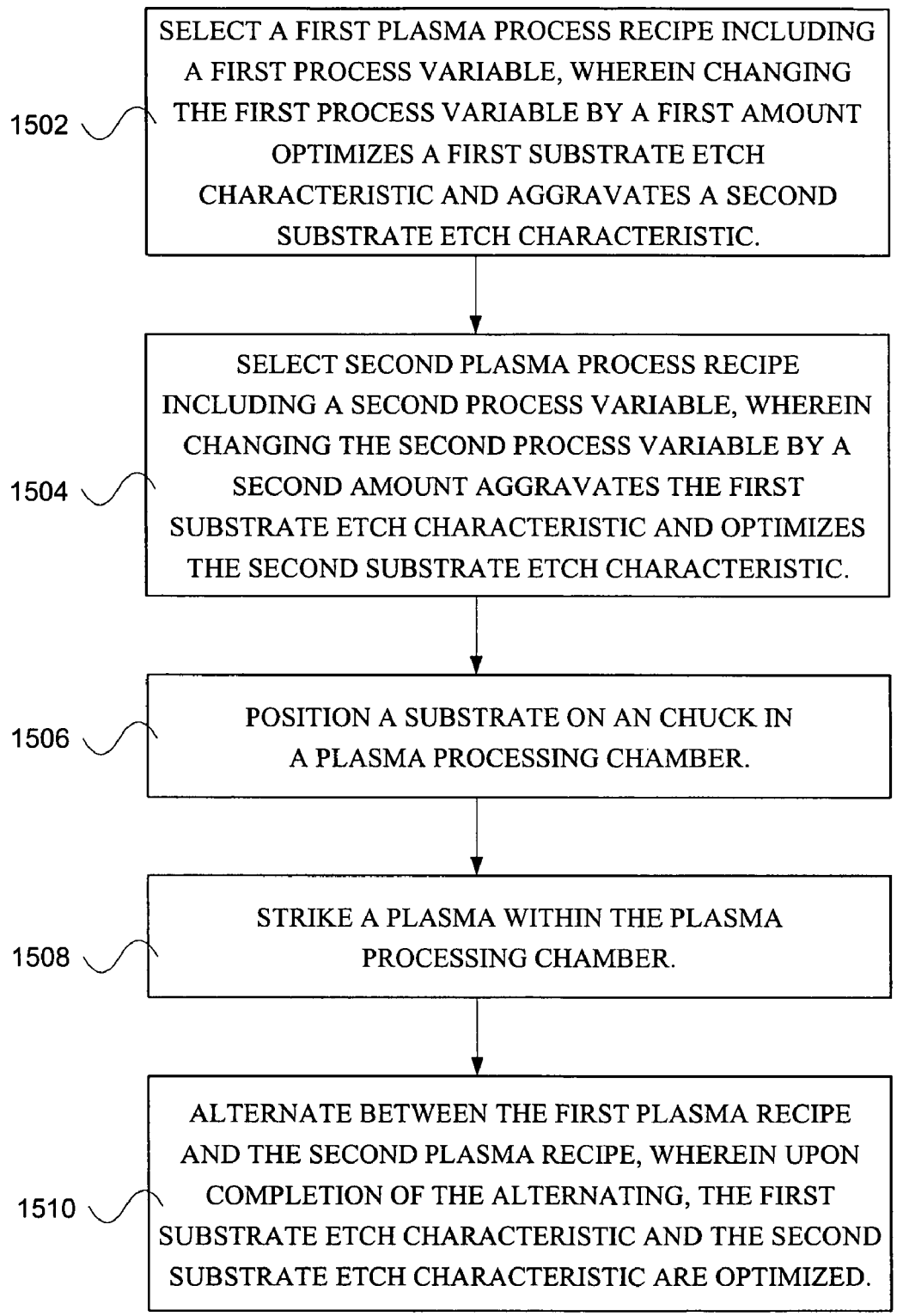
FIG. 15 shows a diagram showing a simplified method for sequentially alternating among plasma processes in a plasma processing system in order to optimize a substrate, according to one embodiment of the invention.

Referring now to FIG. 15, a diagram showing a simplified method for sequentially alternating among plasma processes in a plasma processing system in order to optimize a substrate, according to one embodiment of the invention. Initially, a first plasma process recipe is selected including a first process variable, wherein changing the first process variable by a first amount optimizes a first substrate etch characteristic and aggravates a second substrate etch characteristic, at step 1502. Next, a second plasma process recipe including a second process variable is selected, wherein changing the second process variable by a second amount aggravates the first substrate etch characteristic and optimizes the second substrate etch characteristic, at step 1504. Next, a substrate is positioned on a chuck in a plasma processing chamber, at step 1506. A plasma is then struck within the plasma processing chamber, at step 1508. And finally, the first plasma recipe is alternated with the second plasma recipe, wherein upon completion of the alternating, the first substrate etch characteristic and the second substrate etch characteristic are substantially optimized, at step 1510.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, etc.). It should also be noted that there are many alternative ways of implementing the methods of the present invention.

Advantages of the invention include methods and apparatus for sequentially alternating among plasma processes in order to optimize a substrate. Additional advantages may include compensating for non-uniform etch rate by using two processes with complementary etch profiles, improving substrate yield and throughput, and the maintenance of substrate-to-substrate repeatability.

Having disclosed exemplary embodiments and the best mode, modifications and variations may be made to the disclosed embodiments while remaining within the subject and spirit of the invention as defined by the following claims.

What is claimed is:

1. In a plasma processing system, a method for optimizing etching of a substrate comprising:

selecting a first plasma process recipe including a first process variable with all plasma process characteristics of said first plasma recipe other than said first process variable held constant, wherein changing said first process variable by a first amount optimizes a first substrate etch characteristic and aggravates a second substrate etch characteristic;

selecting a second plasma process recipe including a second process variable with all plasma process characteristics of said second plasma recipe other than said second process variable held constant, wherein changing said second process variable by a second amount aggravates said first substrate etch characteristic and optimizes said second substrate etch characteristic;

positioning a substrate on a chuck in a plasma processing chamber;

striking a plasma within said plasma processing chamber;

alternating between said first plasma recipe and said second plasma recipe, wherein upon completion of said alternating, said first substrate etch characteristic and said second substrate etch characteristic are substantially optimized.

2. The method of claim 1, wherein said first substrate etch characteristic comprises etch rate, said second substrate etch characteristic is etch uniformity, said first process variable is RF power, and said second process variable is chamber pressure.

3. The method of claim 1, wherein said second substrate etch characteristic comprises one of etch rate, uniformity, selectivity, and etch profile.

4. The method of claim 1, wherein said first process variable includes one of process time, RF power, chamber pressure, gas composition, gas flow, substrate bias, and RF frequency.

5. The method of claim 1, wherein said second process variable includes one of process time, RF power, chamber pressure, gas composition, gas flow, substrate bias, and RF frequency.

6. The method of claim 1, wherein said first substrate etch characteristic is etch selectivity, said first process variable is RF power, and said second process variable is chamber pressure.

7. The method of claim 1, wherein substrate second substrate etch characteristic is etch profile, said first process variable is RF power, and said second process variable is chamber pressure.

8. The method of claim 1, wherein said alternating occurs once every predetermined time period.

9. In a plasma processing system, a method for optimizing etching of a substrate comprising:
    selecting a first set of plasma process recipes including a first process variable with all plasma process characteristics of said first plasma recipe other than said first process variable held constant, wherein changing said first process variable by a first amount optimizes a first substrate etch characteristic and aggravates a second substrate etch characteristic;
    selecting a second set of plasma process recipes including a second process variable with all plasma process characteristics of said second plasma recipe other than said second process variable held constant, wherein changing said second process variable by a second amount aggravates said first substrate etch characteristic and optimizes said second substrate etch characteristic;
    positioning a substrate on a chuck in a plasma processing chamber;
    striking a plasma within said plasma processing chamber;
    alternating between a plasma recipe of said first set of plasma recipes and a plasma recipe from said second set of plasma recipes, wherein upon completion of said alternating, said first substrate etch characteristic and said second substrate etch characteristic are substantially optimized.

10. The method of claim 9, wherein said first substrate etch characteristic comprises one of etch rate, uniformity, selectivity, and etch profile.

11. The method of claim 9, wherein said second substrate etch characteristic comprises one of etch rate, uniformity, selectivity, and etch profile.

12. The method of claim 9, wherein said first process variable includes one of process time, RF power, chamber pressure, gas composition, gas flow, substrate bias, and RF frequency.

13. The method of claim 9, wherein said second process variable includes one of process time, RF power, chamber pressure, gas composition, gas flow, substrate bias, and RF frequency.

14. The method of claim 9, wherein said substrate is semiconductor wafer.

15. The method of claim 9, wherein substrate is a glass panel.

16. The method of claim 9, wherein said alternating occurs once every predetermined time period.

17. In a plasma processing system, an apparatus for optimizing etching of a substrate comprising:
    means for selecting a first set of plasma process recipes including a first process variable with all plasma process characteristics of said first plasma recipe other than said first process variable held constant, wherein changing said first process variable by a first amount optimizes a first substrate etch characteristic and aggravates a second substrate etch characteristic;
    means for selecting a second set of plasma process recipes including a second process variable with all plasma process characteristics of said second plasma recipe other than said second process variable held constant, wherein changing said second process variable by a second amount aggravates said first substrate etch characteristic and optimizes said second substrate etch characteristic;
    means for positioning a substrate on a chuck in a plasma processing chamber;
    means for striking a plasma within said plasma processing chamber;
    means for alternating between a plasma recipe of said first set of plasma recipes and a plasma recipe from said second set of plasma recipes, wherein upon completion of said alternating, said first substrate etch characteristic and said second substrate etch characteristic are substantially optimized.

18. The apparatus of claim 17, wherein said first substrate etch characteristic comprises one of etch rate, uniformity, selectivity, and etch profile.

19. The apparatus of claim 17, wherein said second substrate etch characteristic comprises one of etch rate, uniformity, selectivity, and etch profile.

20. The apparatus of claim 17, wherein said first process variable includes one of process time, RF power, chamber pressure, gas composition, gas flow, substrate bias, and RF frequency.

21. The apparatus of claim 17, wherein said second process variable includes one of process time, RF power, chamber pressure, gas composition, gas flow, substrate bias, and RF frequency.

22. The apparatus of claim 17, wherein said substrate is semiconductor wafer.

23. The apparatus of claim 17, wherein substrate is a glass panel.

24. The apparatus of claim 17, wherein said alternating occurs once every predetermined time period.

* * * * *